(12) United States Patent
Matsunami

(10) Patent No.: US 6,951,980 B2
(45) Date of Patent: Oct. 4, 2005

(54) PACKAGE FOR AN ELECTRICAL DEVICE

(75) Inventor: Akira Matsunami, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/967,371

(22) Filed: Sep. 29, 2001

(65) Prior Publication Data
US 2003/0062184 A1 Apr. 3, 2003

(51) Int. Cl.⁷ .............................................. H01L 23/28
(52) U.S. Cl. .................... 174/52.2; 257/668; 257/676; 257/693; 257/787; 174/52.4
(58) Field of Search ................ 174/52.4, 52.2; 257/668, 676, 693, 696, 787; 361/768, 774, 777

(56) References Cited

U.S. PATENT DOCUMENTS

| | | | | |
|---|---|---|---|---|
| 5,723,904 A | | 3/1998 | Shiga | 257/698 |
| 5,729,437 A | * | 3/1998 | Hashimoto | 361/760 |
| 5,821,608 A | * | 10/1998 | DiStefano et al. | 257/669 |
| 6,081,029 A | * | 6/2000 | Yamaguchi | 257/718 |
| 6,111,306 A | * | 8/2000 | Kawahara et al. | 256/666 |
| 6,265,673 B1 | | 7/2001 | Higashida et al. | 174/260 |
| 6,303,978 B1 | * | 10/2001 | Daniels et al. | 257/642 |
| 6,384,478 B1 | * | 5/2002 | Pour | 257/724 |
| 2001/0007371 A1 | | 7/2001 | Kawaguchi | 257/698 |

* cited by examiner

Primary Examiner—Hung V. Ngo
(74) Attorney, Agent, or Firm—Wade James Brady, III; Frederick J. Telecky, Jr.

(57) ABSTRACT

A package for an electrical device having at least one connection locus for providing selected electrical access to the device includes: (a) a substrate having an accommodation site; (b) at least one electrically conductive mass arranged with the substrate in a neighboring relationship with the accommodation site; (c) at least one connection structure coupling the at least one connection locus with the at least one conductive mass when the device is situated at the accommodation site in an assembled orientation; and (d) an enclosing structure substantially enclosing the device and a portion of the substrate. The enclosing structure and the at least one conductive mass cooperate to present at least one contact structure accessible from exterior of the enclosing structure configured for effecting surface mounting of the package in a circuit.

8 Claims, 9 Drawing Sheets

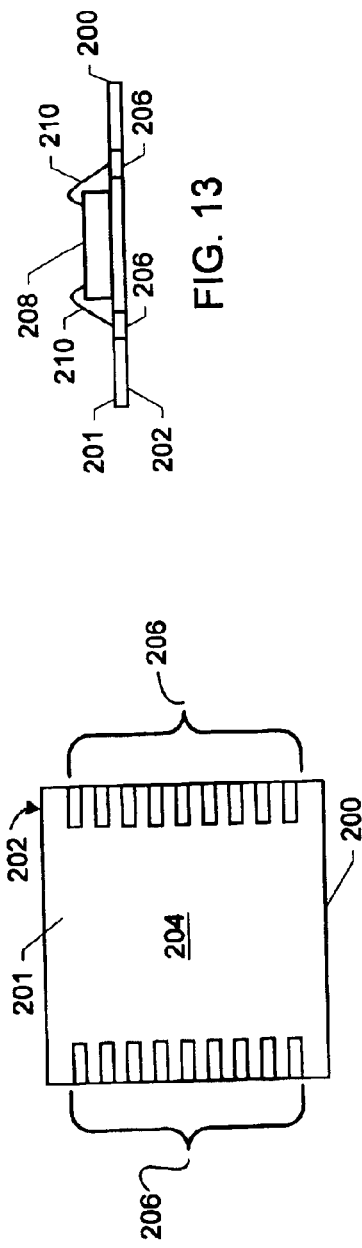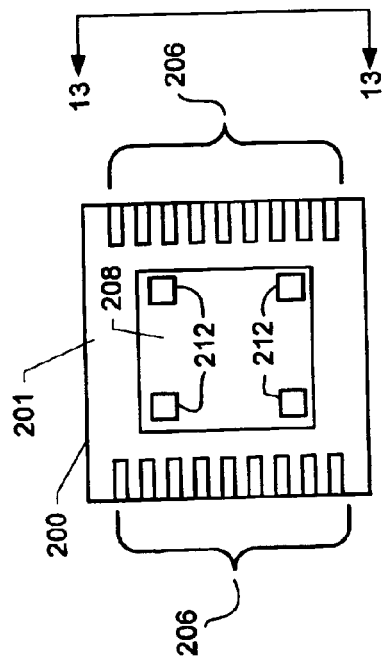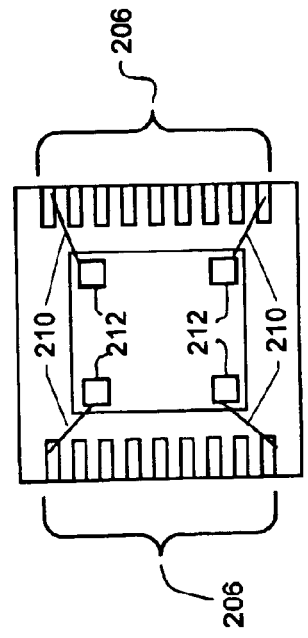

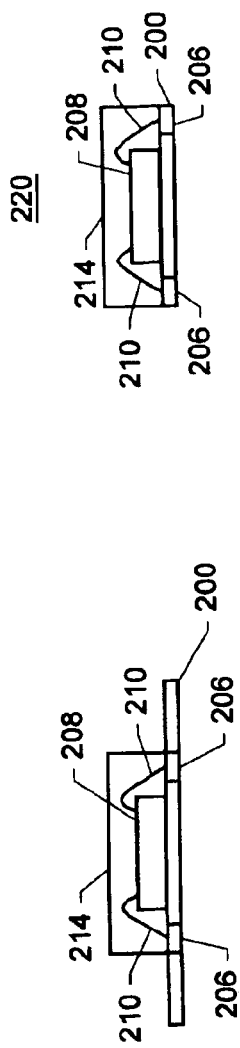
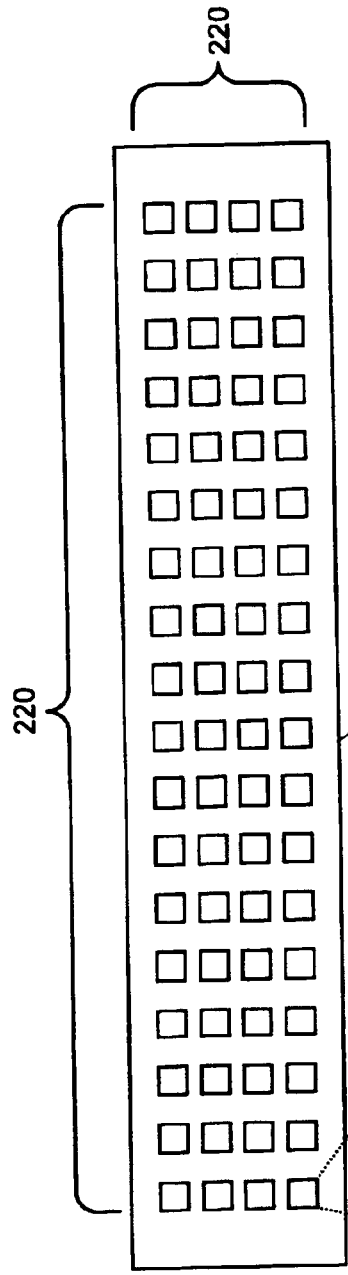
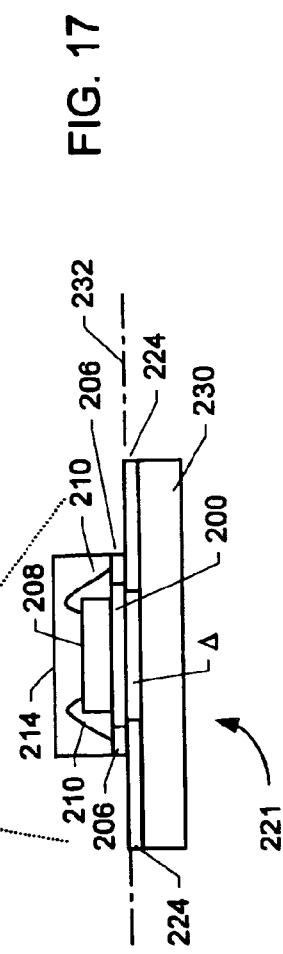
FIG. 15
FIG. 16
FIG. 17

PACKAGE FOR AN ELECTRICAL DEVICE

BACKGROUND OF THE INVENTION

The present invention is directed to a package for electrical devices. The present invention is especially useful in packaging electronic devices such as integrated circuits or similar electrical devices. The present invention provides a small package of increased robustness that is amenable to surface mounting in circuitry in a manner that is economical in its occupation of board space.

Prior art electrical device packages, such as dual in line packages and small outline packages, present contact structures extending from a plastic package body for providing electrical access with the electrical device that is contained within the package body. With such prior art packages, the contact structures are susceptible to bending or breaking during their manufacture or during their being assembled in circuit board arrangements for inclusion in a product. Further, the extension of the contact structures from the package body requires that the package will occupy board space that is larger than the space required for accommodating the package body alone. That is, there is a "real estate" overhead that is incurred by using such prior art packages that have extending contact structures. In today's market manufacturers are ever striving to produce smaller, more compact products. Because of the emphasis on smaller products, real estate occupied by respective components of a product is an important consideration in designing products.

The package of the present invention provides a significant advantage in creating a compact product. The package of the present invention provides a robust component that can endure the rigors of manufacturing and assembly with a significantly lesser likelihood of suffering bent or broken contact structures than is experienced by prior art package designs because the present invention does not present any extended contact structures. The package of the present invention uses less material for establishing electrical access to the electrical device contained within the package than is used with prior art packages. Contact material is often an expensive material, such as gold-plated metal or a similar material. Use of a lesser amount of contact material provides cost savings in the package of the present invention over prior art packaging structures.

SUMMARY OF THE INVENTION

A package for an electrical device having at least one connection locus for providing selected electrical access to the device includes: (a) a substrate having an accommodation site; (b) at least one electrically conductive mass arranged with the substrate in a neighboring relationship with the accommodation site; (c) at least one connection structure coupling the at least one connection locus with the at least one conductive mass when the device is situated at the accommodation site in an assembled orientation; and (d) an enclosing structure substantially enclosing the device and a portion of the substrate. The enclosing structure and the at least one conductive mass cooperate to present at least one contact structure accessible from exterior of the enclosing structure configured for effecting surface mounting of the package in a circuit.

It is, therefore, an object of the present invention to provide a package for an electrical device that is advantageous for creating a compact product.

It is a further object of the present invention to provide a package for an electrical device that presents a robust component that can endure the rigors of manufacturing and assembly with a lesser likelihood of suffering bent or broken contact structures than is experienced by prior art package designs.

It is yet a further object of the present invention to provide a package for an electrical device that is less expensive to manufacture than prior art package designs.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIGS. 11–16 illustrate the electrical device package of the present invention during various of the method steps for its manufacture.

FIG. 17 is a schematic representation of incorporating the electrical device package of the present invention into an array of such devices.

DETAILED DESCRIPTION OF THE PREFERRED EMBODIMENT

Figure 3:
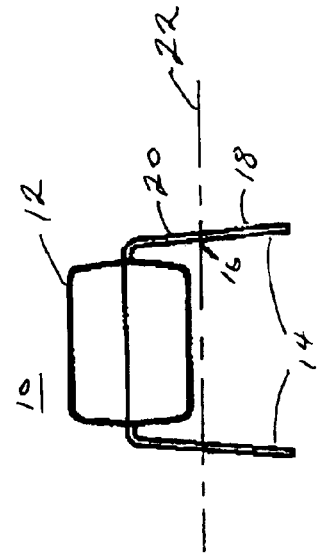
FIGS. 1–4 illustrate a first embodiment of a prior art electrical device package.
Figure 1:
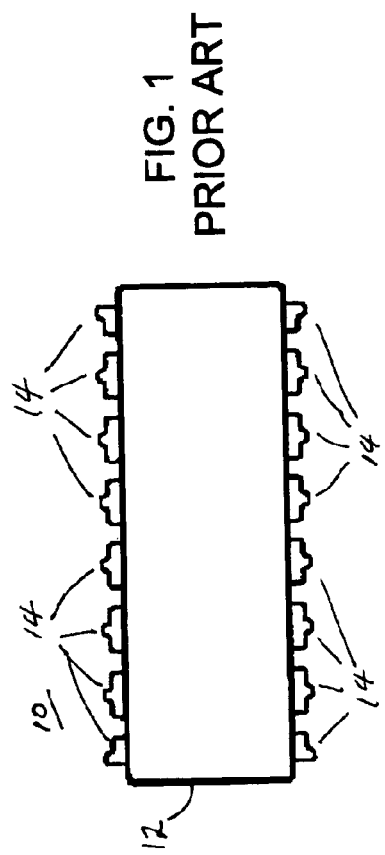
Figure 2:
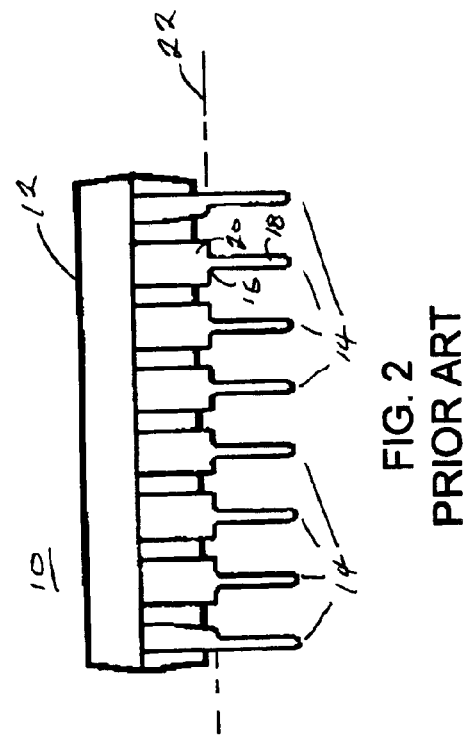
Figure 4:
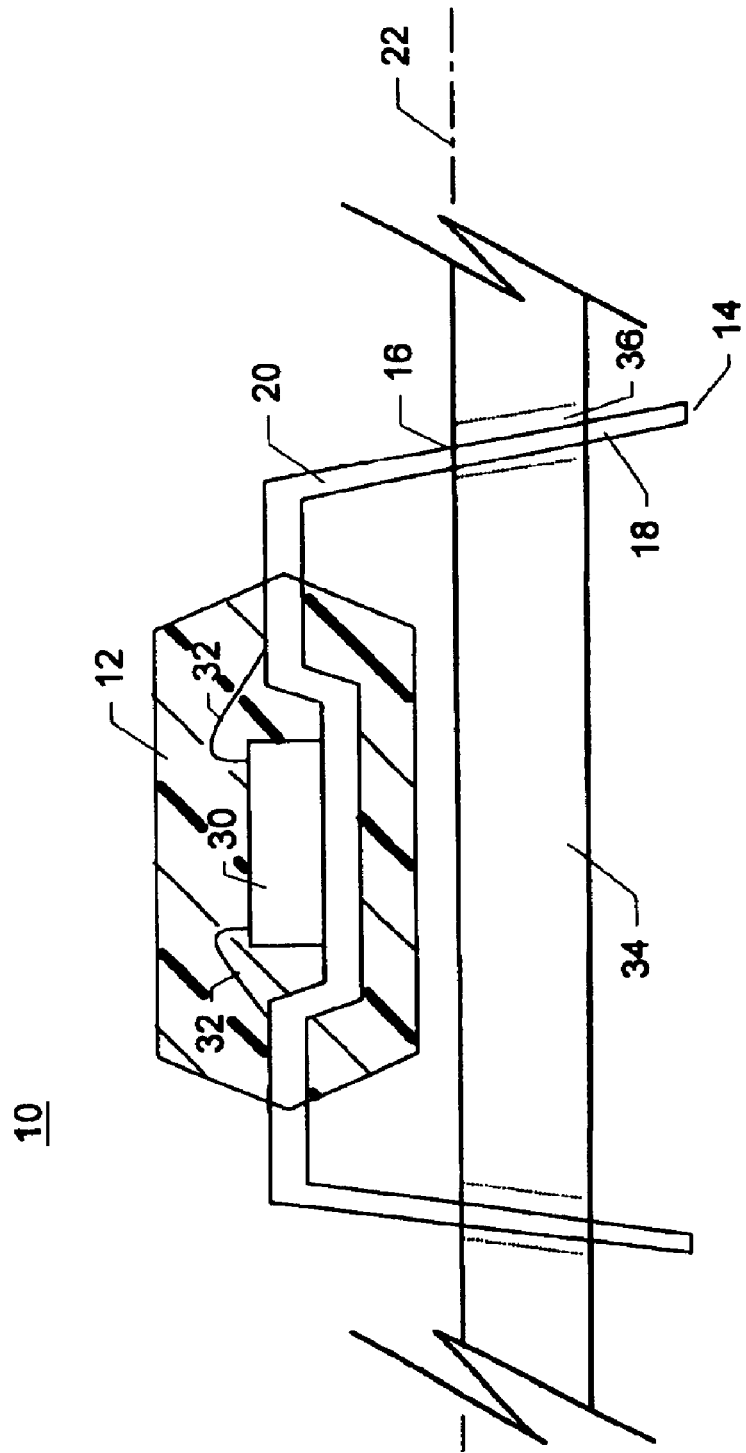

FIGS. 1–4 illustrate a first embodiment of a prior art electrical device package. In FIGS. 1–3, a dual in-line package (DIP) 10 includes a package body 12 containing an electrical device (not shown in FIGS. 1–3). Contact structures 14 extend from body 12 to provide electrical access with the electrical device contained within package 10. Each contact structure 14 includes a transition area 16 from a first portion 18 to a second portion 20. First portion 18 has a smaller width than second portion 20. When package 10 is assembled with a circuit board (FIG. 4) a through hole in the circuit board is sized to accommodate passing through of first portion 18 but to block passing through of second portion 20. By such an arrangement, transition structures 16 for contact structures 14 cooperate to establish a seating plane 22. Package 10 rests upon seating plane 22 when package 10 is installed with a circuit board arrangement (FIG. 4).

In FIG. 4, a package 10 is assembled with a circuit board arrangement illustrated in a partial section view. An electrical device 30 is contained within package body 12. Package body 12 is a substantially solid molded body containing electrical device 30 from which contact structures 12 extend. Respective contact structures 12 are electrically coupled with electrical device 30 by bonding wires 32. Although not shown in detail in FIG. 4, those skilled in the relevant art will recognize that respective contact structures 14 are electrically discrete within body 12 in order to provide selective electrical connection with electrical device 30 via bonding wires 32.

Package 10 is mounted with a circuit board 34 by inserting contact structures 14 within through holes 36. As mentioned earlier, through holes 36 are dimensioned to receive first portions 18 of contact structures 14 while not admitting second portions 20. By this structure, package 10 rests upon circuit board 34 substantially on seating plane 22 when assembled with circuit board 34. Through holes 36 are filled with solder or another conductive material to effect electrical connection with contact structures 14. Through holes 36 are selectively coupled with circuit traces or other circuit elements in or on circuit board 34 (not shown in FIG. 4) in a manner known in the art to include electrical device 30 within circuitry on or within circuit board 34.

Figure 5:
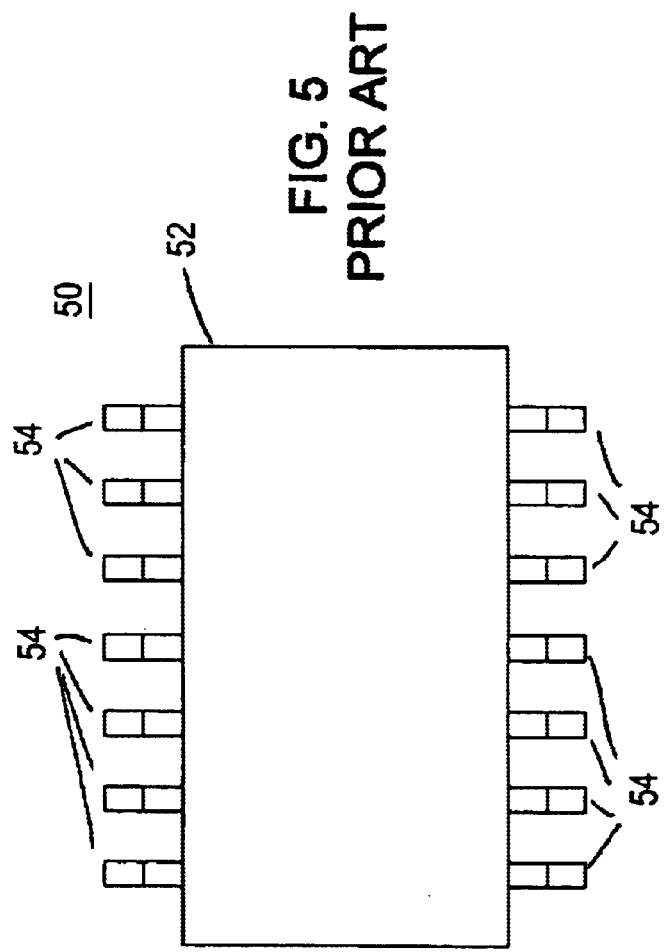
FIGS. 5–8 illustrate a second embodiment of a prior art electrical device package.
Figure 7:
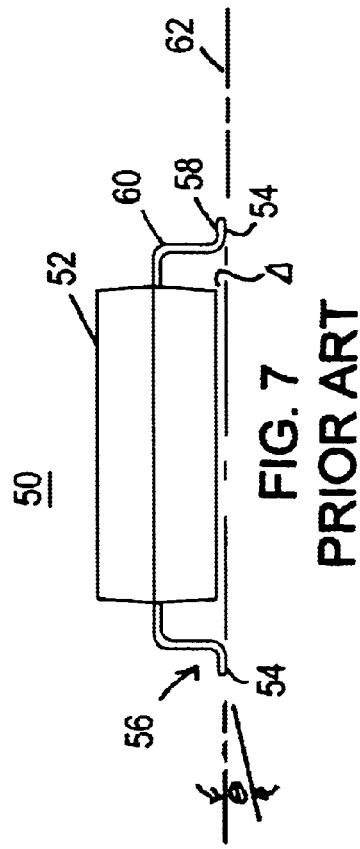
Figure 6:
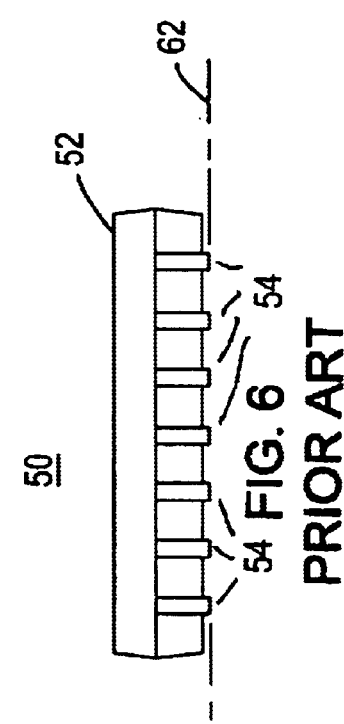
Figure 8:
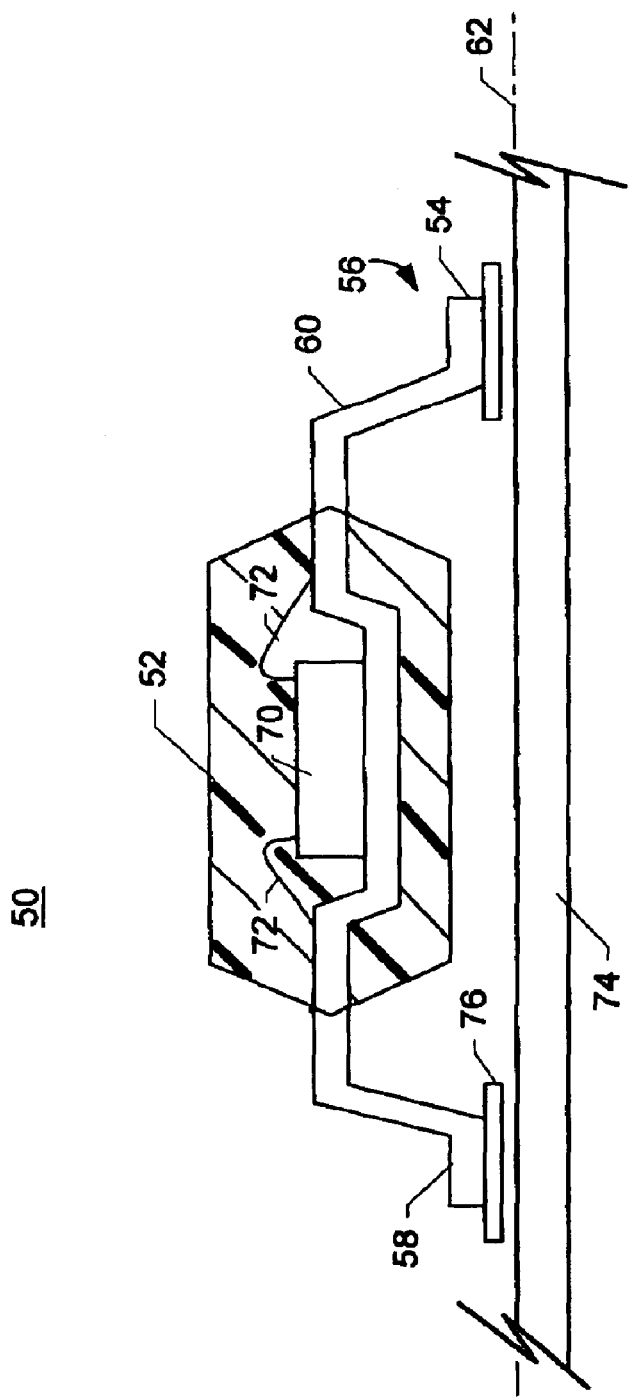

FIGS. 5–8 illustrate a second embodiment of a prior art electrical device package. In FIGS. 5–7, a small outline package 50 includes a package body 52 containing an electrical device (not shown in FIGS. 5–7). Contact structures 54 extend from body 52 to provide electrical access with the electrical device contained within package 50. Each contact structure 54 includes a transition area 56 from a lower portion 58 to an upper portion 60. When package 50 is assembled with a circuit board (FIG. 8) lower portions 58 of contact structures 54 cooperate to establish a seating plane 62 upon which package 50 rests in an installed orientation (FIG. 8). Lower portion 58 may be angularly displaced from seating plane 63 by an angle θ to establish a standoff distance Δ between seating plane 62 and package body 52 in the installed orientation. In the alternative, contact structures 54 may extend below package body 50 a distance sufficient to establish standoff distance between seating plane 62 and package body 52 in the installed orientation (FIG. 8).

In FIG. 8, a package 50 is assembled with a circuit board arrangement. An electrical device 70 is contained within package body 52. Package body 52 is a substantially solid molded body containing electrical device 70 from which contact structures 52 extend. Respective contact structures 52 are electrically coupled with electrical device 70 by bonding wires 72. Although not shown in detail in FIG. 8, those skilled in the relevant art will recognize that respective contact structures 54 are electrically discrete within body 52 in order to provide selective electrical connection with electrical device 70 via bonding wires 72.

Package 50 is mounted with a circuit board 74 by affixing contact structures 54 with bonding loci, or pads, 76. Affixing may be effected using solder, conductive adhesive, or another affixing technology appropriate to establish an electrically conductive bond between a respective contact structure 54 and a respective bonding pad 76. By this structure, package 50 rests upon circuit board 74 substantially on seating plane 62 when assembled with circuit board 74. Bonding pads 76 are selectively coupled with circuit traces or other circuit elements in or on circuit board 74 (not shown in FIG. 8) in a manner known in the art to include electrical device 70 within circuitry on or within circuit board 74.

Figure 9:
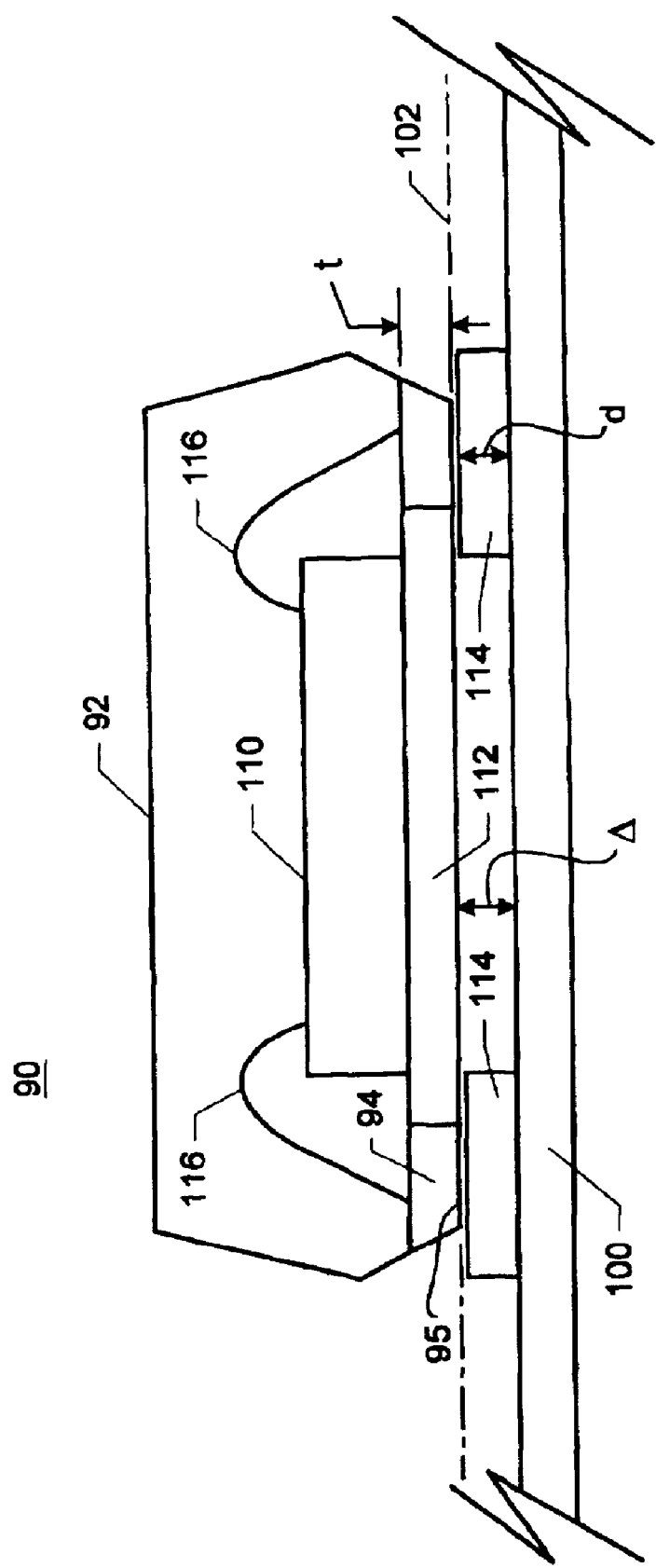
FIG. 9 is a schematic elevation partial section view of an electrical device package according to the present invention.

FIG. 9 is a schematic elevation partial section view of an electrical device package according to the present invention. In FIG. 9, a package 90 includes a package body 92 containing an electrical device 110. Electrical device 110 rests upon a substrate 112. Contact structures 94 may be embedded in substrate 112 (as illustrated in FIG. 9) or wrapped around an edge of substrate 112. In either embodiment, contact structures 94 present electrical access for selectively coupling electrical device 110 with respective contact structures 94 within body 92 using bonding wires 116, and also present electrical access for coupling contact structures 94 with circuitry on or within a circuit board 100 via mounting structures 114. In the embodiment of contact structures 94 illustrated in FIG. 9, contact structures 94 are substantially planar contact pads having a thickness t. Contact structures 94 present an electrically conductive land 95 that is accessible from outside body 92 to provide electrical coupling with electrical device 110 contained within package 90. When package 90 is assembled with circuitry on or within circuit board 100 conductive lands 95 of contact structures 94 and substrate 112 cooperate to establish a seating plane 102 upon which package 90 rests in an installed orientation. Conductive lands 95 may be coupled with mounting structures 114 using electrical connection structures employing surface mounting, solder ball, conductive adhesive or other connection techniques known in circuit fabrication. The particular coupling technique employed for coupling conductive lands 95 with mounting structures 114 determines a separation or standoff distance Δ between substrate 112 and circuit board 100. Mounting structures 114 may be configured to extend a distance d above circuit board 100 to contribute to standoff distance Δ. Mounting structures 114 are selectively coupled with circuit traces or other circuit elements in or on circuit board 100 (not shown in FIG. 9) in a manner known in the art to include electrical device 110 within circuitry on or within circuit board 100.

Figure 10:
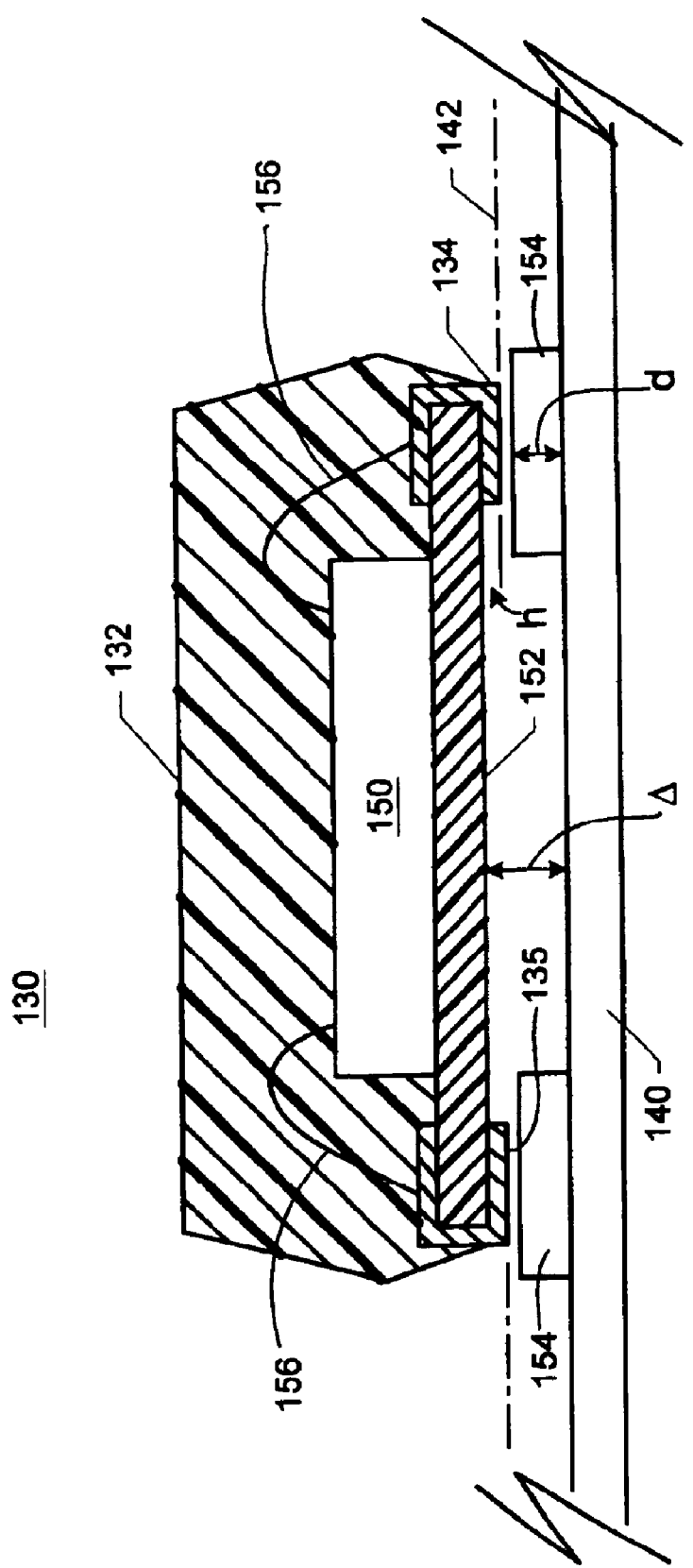
FIG. 10 is a schematic elevation partial section view of an alternate embodiment of an electrical device package according to the present invention.

Package body 92 is preferably a substantially solid molded body containing electrical device 110 (FIG. 10). Alternatively, package body 92 may be embodied in a shell structure that establishes a substantially enclosed atmosphere about electrical device 110, as illustrated in FIG. 9. Although not shown in detail in FIG. 9, those skilled in the relevant art will recognize that respective contact structures 94 are electrically discrete within body 92 in order to provide selective electrical connection with electrical device 1110 via bonding wires 116.

FIG. 10 is a schematic elevation partial section view of an alternate embodiment of an electrical device package according to the present invention. In FIG. 10, a package 130 includes a package body 132 containing an electrical device 150. Electrical device 150 rests upon a substrate 152. Contact structures 134 are substantially U-shaped and are wrapped around an edge of substrate 152. Contact structures 134 present electrical access for selectively coupling electrical device 150 with respective contact structures 134 within body 132 using bonding wires 156, and also present electrical access for coupling contact structures 134 with circuitry upon or within a circuit board 140 via mounting structures 154. Contact structures 134 present an electrically conductive land 135 that is accessible from outside body 132 to provide electrical coupling with electrical device 150 contained within package 130. Conductive lands are displaced from substrate 152 by a thickness h of contact structure 134. When package 130 is assembled with circuitry on or within circuit board 140 conductive lands 135 of contact structures 134 and substrate 152 cooperate to establish a seating plane 142 upon which package 130 rests in an installed orientation. Seating plane 142 is separated from substrate 152 by thickness h of contact structures 134. Conductive lands 135 may be coupled with mounting structures 154 using electrical connection structures employing surface mounting, solder ball, conductive adhesive or other connection techniques known in circuit fabrication. The particular coupling technique employed for coupling conductive lands 135 with mounting structures 154 determines a separation or standoff distance Δ between substrate 152 and circuit board 140. Mounting structures 154 may be configured to extend a distance d above circuit board 140 to contribute to standoff distance Δ. Mounting structures 154 are selectively coupled with circuit traces or other circuit elements on or within circuit board 140 (not shown in FIG. 10) in a manner known in the art to include electrical device 150 within circuitry associated with circuit board 140.

Package body 132 is preferably a substantially solid molded body containing electrical device 150 (FIG. 10). In the alternative, package body 132 may be embodied in a shell structure that establishes a substantially enclosed atmosphere about electrical device 114 (FIG. 9). Although not shown in detail in FIG. 10, those skilled in the relevant art will recognize that respective contact structures 134 are electrically discrete within body 132 in order to provide selective electrical connection with electrical device 150 via bonding wires 156.

FIGS. 11–16 illustrate the electrical device package of the present invention during various of the method steps for its manufacture. In FIG. 11, a substrate 200 having a first side 201 (facing toward the reader) and a second side 202 (facing away from the reader) has an accommodation site 204 appropriately sized for receiving an electrical device 208 (FIG. 12). A plurality of electrically conductive lands 206 are arranged in a pattern about accommodation site 204.

As illustrated in FIG. 12, an electrical device 208 is situated at accommodation site 204. Electrical device 208 may be affixed to substrate 200 using adhesive, welding, sonic welding or another affixation technique appropriate for the materials employed. Alternatively, electrical device 208 may be held in place temporarily using an assembly fixture or jig arrangement until a housing is installed (later in the manufacturing process), which housing is configured for imposing a force upon electrical device 208 sufficient to affix electrical device 208 at accommodation site 204 in an assembled orientation. Electrical device 208 has a plurality of connection loci 212 to provide selected electrical access to within electrical device 208.

FIG. 13 is a side view of the assembly illustrated in FIG. 12, taken along Section 13—13 in FIG. 12. In order to avoid cluttering FIG. 13, only representative conductive lands 206 are included in FIG. 13. In FIG. 13 selected connection loci 212 (not visible in FIG. 13) in electrical device 208 are electrically coupled with selected conductive lands 206 on substrate 200 in the assembled orientation. Coupling between selected connection loci 212 and selected conductive lands 206 is effected by a plurality of connection structures 210, such as bonding wires.

FIG. 14 is a top view of the assembled orientation of electrical device 208 illustrated in FIG. 13, affixed upon substrate 200 with connection structures 210 effecting coupling between selected conductive lands 206 and selected connection loci 212.

In FIG. 15, an enclosing structure, or package body 214 is installed to substantially enclose electrical device 208. Package body 214 may also substantially enclose at least first side 201 of substrate 200, including portions of conductive lands 206 facing first side 201 and connection structures 210. Portions of conductive lands 206 facing second side 202 are preferably not enclosed within package body 214.

FIG. 16 illustrates a packaged device 220 formed by trimming substrate 200 substantially flush with package body 214 to establish a compact robust package structure presenting conductive lands 206 for effecting surface mounting of package 220 in a circuit.

FIG. 17 is a schematic representation of incorporating the electrical device package of the present invention into an array of such devices. In FIG. 17, a plurality of packaged devices 220 are coupled with circuitry (not shown in detail in FIG. 17) associated with a circuit board 230. A representative package device 221 is illustrated in detail to more clearly indicate how each respective packaged device 220 is coupled with circuit board 230.

Representative packaged device 221 includes a package body 214 containing an electrical device 208. Electrical device 208 rests upon a substrate 200. Contact structures 206 may embeddedly traverse substrate 200. That is, substrate 200 has a transplanar dimension having a first extremity at first side 201 and a second extremity at second side 202 (FIG. 13). Contact structures 206 may extend through substrate 200 from the first extremity of the transplanar dimension of substrate 200 at first side 201 to the second extremity of the transplanar dimension of substrate 200 at second side 202. Alternatively, contact structures 206 may have a generally U-shape and may be wrapped around an edge of substrate 200 to extend from the first extremity of the transplanar dimension of substrate 200 at first side 201 of substrate 200 to the second extremity of the transplanar dimension at second side 202 of substrate 200. In either embodiment, contact structures 206 present electrical access for selectively coupling electrical device 208 with respective contact structures 206 within body 214 using bonding wires 210, and also present electrical access for coupling contact structures 206 with circuitry upon or within circuit board 230 via mounting structures 224. In the embodiment of contact structures 206 illustrated in FIG. 17, contact structures 206 present an electrically conductive land that is accessible from outside body 214 to provide electrical coupling with electrical device 208 contained within package 221. When package 221 is assembled with circuitry on or within circuit board 230 conductive lands of contact structures 206 cooperate with substrate 200 to establish a seating plane 232 upon which package 221 rests in an installed orientation. Conductive lands 206 may be coupled with mounting structures 224 using electrical connection structures employing surface mounting, solder ball, conductive adhesive or other connection techniques known in circuit fabrication. The particular coupling technique employed for coupling conductive lands 206 with mounting structures 224 determines a separation or standoff distance Δ between substrate 200 and circuit board 230. Mounting structures 224 may be configured to extend a distance above circuit board 230 to contribute to standoff distance Δ. Mounting structures 224 are selectively coupled with circuit traces or other circuit elements in or on circuit board 230 (not shown in detail in FIG. 17) in a manner known in the art to include electrical device 208 within circuitry associated with circuit board 230.

Package body 214 is preferably a substantially solid molded body containing electrical device 208 (FIG. 10). In the alternative, package body 214 may be embodied in a shell structure that establishes a substantially enclosed atmosphere about electrical device 208 (FIG. 9). Although not shown in detail in FIG. 17, those skilled in the relevant art will recognize that respective contact structures 206 are electrically discrete within body 214 in order to provide selective electrical connection with electrical device 208 via bonding wires 210.

Figure 18:
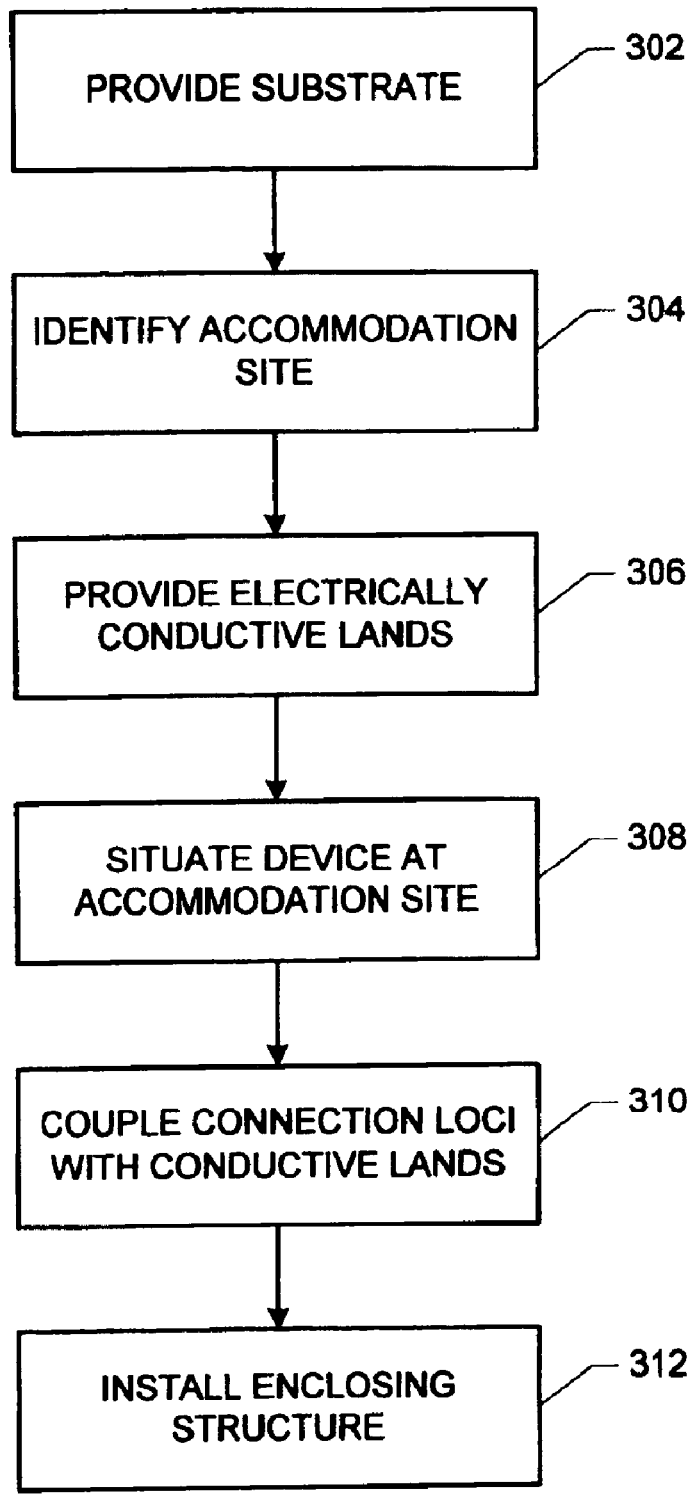
FIG. 18 is a flow diagram illustrating the method of the present invention.

FIG. 18 is a flow diagram illustrating the method of the present invention. In FIG. 18, a method 300 for manufacturing a package containing an electrical device is illustrated. The device has a plurality of connection loci for providing selected electrical access to the device.

Method 300 begins with the step of providing a substantially planar substrate, as indicated by a block 302. The substrate has a first side and a second side.

Method 300 continues with identifying an accommodation site on one side of the first side and the second side of the substrate, as indicated by a block 304.

Method 300 continues with providing a plurality of electrically conductive lands arranged in a pattern about the accommodation site, as indicated by a block 306. The plurality of conductive lands are electrically accessible from the first side and from the second side of the substrate.

Method 300 continues with situating the device at the accommodation site in an assembled orientation, as indicated by a block 308.

Method 300 continues with coupling a plurality of connection structures with selected connection loci of the plurality of connection loci and with selected conductive lands of the plurality of conductive lands, as indicated by a block 310.

Method 300 concludes with installing an enclosing structure substantially enclosing the device and the one side of the substrate, as indicated by a block 312. The enclosing structure and the plurality of conductive lands cooperate to present particular conductive lands of the plurality of conductive lands electrically accessible from exterior of the enclosing structure for effecting surface mounting of the package in a circuit.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. A package for an electrical device comprising:
   an electrically insulating substrate; said substrate having an accommodation surface thereon for an electrical device and an opposing surface;
   at least one electrically conductive mass in contact with and extending through said substrate and having a surface coplanar with said opposing surface of said substrate, said electrically conductive mass having substantially uniform dimensions through said substrate and having at least one edge coincident with an edge of said substrate;
   an electrical device disposed on said accommodations surface and having at least one connection locus thereon;
   at least one connection structure coupling at least one connection locus with said at least one conductive mass; and
   an enclosing structure enclosing said electrical device and said substrate; said enclosing structure and said at least one conductive mass cooperating to present at least one contact structure accessible from exterior of said enclosing structure; said at least one contact structure being configured for effecting surface mounting of the package in a circuit.

2. A package for an electrical device as recited in claim 1 wherein said substrate is substantially planar and has a substantially constant transplanar dimension.

3. A package for an electrical device as recited in claim 2 wherein said at least one conductive mass is substantially coplanar with said substrate and has substantially said constant transplanar dimension.

4. A package for an electrical device as recited in claim 2 wherein said at least one conductive mass extends through said substrate to present a contact pad structure substantially at each extremity of said transplanar dimension.

5. A package for an electrical device as recited in claim 2 wherein said at least one conductive mass extends around said edge of said substrate to present a contact pad substantially at each extremity of said transplanar dimension.

6. A package for an electrical device as recited in claim 1 wherein said enclosing structure is a shell structure; said shell structure cooperating with said substrate to establish an enclosed atmosphere about said device.

7. A package for an electrical device as recited in claim 1 wherein said enclosing structure is a substantially solid structure.

8. A method for manufacturing a package containing an electrical device comprising the steps of:
   providing an electrically insulating, substantially planar substrate having a first side and an opposing second side and having an accommodation site on said first side of said substrate;
   providing a plurality of electrically conductive lands arranged in a pattern about said accommodation site, said plurality of conductive lands in contact with and extending through said substrate and electrically accessible from said first side and from said second side, wherein each of said plurality of conductive lands has substantially uniform dimensions through said substrate and has at least one edge coincident with an edge of said substrate;
   providing an electrical device having a plurality of connection loci at said accommodation site;
   coupling a plurality of connection structures with selected connection loci of said plurality of connection loci and with selected conductive lands of said plurality of conductive lands; and
   enclosing said device and said one side of said substrate in an enclosing structure, said enclosing structure and said plurality of conductive lands cooperating to present particular conductive lands of said plurality of conductive lands electrically accessible from exterior of said enclosing structure for effecting surface mounting of the package in a circuit.

* * * * *